United States Patent [19]
Shimizu et al.

[11] Patent Number: 4,634,600
[45] Date of Patent: Jan. 6, 1987

[54] SURFACE TREATMENT PROCESS

[75] Inventors: Yasuhiro Shimizu; Akira Doi, both of Itami, Japan

[73] Assignee: Sumitomo Electric Industries, Ltd., Osaka, Japan

[21] Appl. No.: 746,388

[22] Filed: Jun. 19, 1985

[30] Foreign Application Priority Data

Jun. 29, 1984 [JP] Japan ................................ 59-136024

[51] Int. Cl.4 ............................................................ B05D 3/06
[52] U.S. Cl. ................................... 427/38; 204/192.31; 427/39
[58] Field of Search ................ 427/38, 39; 204/192 N

[56] References Cited

U.S. PATENT DOCUMENTS 3,915,757 10/1975 Engel ...................................... 427/38
4,137,370 1/1979 Fujishiro et al. ...................... 427/38
4,181,590 1/1980 Fujishiro et al. ...................... 427/38
4,351,695 9/1982 Hieber et al. ......................... 427/38
4,520,040 5/1985 Cordts ................................... 427/38
4,520,268 5/1985 Xu ......................................... 427/39

FOREIGN PATENT DOCUMENTS 64507 4/1982 Japan .

Primary Examiner—John H. Newsome
Attorney, Agent, or Firm—W. G. Fasse; D. H. Kane, Jr.

[57] ABSTRACT

A substrate is treated for forming a thin film on the surface of the substrate to obtain a hard layer adhering to the substrate surface. For this purpose the substrate is placed in a metal vapor atmosphere and simultaneously bombarded by metal or nonmetal ions which are implanted into the substrate while the metal vapor atmosphere is also being ionized.

10 Claims, 4 Drawing Figures

SURFACE TREATMENT PROCESS

BACKGROUND OF THE INVENTION

1. Field of the Invention

The present invention relates to a surface treatment process for forming a thin film on the surface of a substrate to provide a hard surface layer.

2. Description of the Prior Art

In order to obtain hard layers on the surfaces of substrates, there have been proposed a PVD (physical vapor deposition) process such as an ion plating process and a CVD (chemical vapor deposition) process employing chemical reaction under a high temperature. These processes are adapted to form hard layers of carbide, nitride, oxide, boride or the like of several microns in thickness on the surfaces of substrates. The hard layers thus formed different thickness in different spots on the substrate, and hence said processes cannot be applied where a layer having an accurate thickness is required.

The CVD process is adapted to form a thin film under a considerably high temperature, whereby adhesion is obtained finely to some extent between the substrate and the surface-coating film. By the CVD process, however, an brittle layer is formed between the metal substrate and the surface-coating film, thereby to reduce strength of the adhesion to the substrate. On the other hand, the ion plating process is adapted to form a hard layer under a relatively low temperature in comparison with the CVD process. However, the adhesion between the substrate and the surface-coating film obtained by the ion plating process is not sufficient.

A process of injecting a nonmetal ion into a substrate as a surface treatment process has been proposed for forming a hard layer. However, such injecting process cannot be applied to all types of substrates, and application thereof is limited to those materials which react with a nonmetal ion to be hardened. For example, the surface layer is hardened by injecting a nitrogen ion into an Fe-alloy, whereas no surface layer is hardened by injecting the nitrogen ion into a Co-alloy or Ni-alloy.

In order to overcome the aforementioned problem, the inventors have proposed an improved surface treatment process in Japanese patent application No. 64507/1982 (patent laying-open gazette No. 181864/1983) filed on Apr. 16, 1982. This surface treatment process is characterized in that the nitrogen ion is injected into a substrate in a metal vapor atmosphere provided around the substrate to be treated. When, for example, Ti is employed as an atmospheric metal in this process, Ti is also injected with the nitrogen ion into the surface of the substrate. Thus, Ti and the nitrogen ion partially react with each other to generate strong nuclei of TiN on the surface, thereby to facilitate hardening of the surface. However, there is yet room for improvement in this process. Namely, Ti and N in the surface-coating film are preferably provided in the form of TiN coupled substantially in the ratio of 1:1 in order to improve adhesion between the substrate and the surface-coating film and increase hardness of the surface-coating film. However, the rate of Ti, which serves as the atmospheric metal, is inevitably increased in the aforementioned process combining vapor deposition and ion injection.

SUMMARY OF THE INVENTION

Accordingly, an object of the present invention is to provide a surface treatment process which develops and improves the process disclosed in Japanese patent application No. 64507/1982 to further improve adhesion between the substrate and the surface-coating film, and which can appropriately adjust the ratio of concentration of the vaporized metal and the injected ion.

The present invention provides a surface treatment process which is characterized in that a metal vapor atmosphere is formed around a treated substrate thereby to inject a metal or nonmetal ion into the substrate with the metal vapor being ionized.

According to the present invention, metal particles in the ionized metal vapor reach the treated substrate under high energy to firmly adhere to the substrate. Further, the metal particles in the metal vapor are injected into the surface of the substrate with the ion to be injected. The evaporation metal and the injected ion are thus knocked on the substrate so that no clear interface is present between the substrate and the surface-coating film, thereby to improve adhesion of the same. Preferably, the injected ion is accelerated by an ion source to strike the surface of the treated substrate thereby to activate the said surface, and hence adhesion of the substrate and the surface-coating film is further facilitated. Further, since the metal particles in the metal vapor are ionized, reactivity thereof is increased to form a hard compound such as TiN, thereby to facilitate hardening of the surface.

In addition, conditions such as the amount of evaporation of the metal, the degree of ionization of the metal vapor, the value of an acceleration voltage applied to the treated substrate, the value of an acceleration voltage to the injected ion, the quantity of the injected ion and the temperature of the substrate may be appropriately set in order to optimally adjust the ratio of concentration of the metal particles in the metal vapor forming the surface-coating film to the injected ion. Thus, when, for example, Ti is employed as the evaporation metal and N is employed as the injected ion, Ti and N can be provided in the ratio of 1:1.

Preferably the evaporation metal is formed by a substance or two or more substances selected from a group of Ti, Zr, Hf, V, Nb, Ta, Cr, Mo, W, Si, Al and B and the injected metal or nonmetal ion is formed by a substance or two or more substances selected from a group of $N_2^+$, $N^+$, $O_2^+$, $C^+$, $Si^+$ and $B^+$. Typical combinations for obtaining excellent hard layers are, for example, Ti employed as the evaporation metal and $N_2^+$ employed as the injected ion, Al employed as the evaporation metal and $O_2^+$ employed as the injected ion, Ti employed as the evaporation metal and $C^+$ employed as the injected ion and B employed as the evaporation metal and $N_2^+$ employed as the injected ion.

Ionization of the metal vapor is effectively performed by, for example, radio-frequency discharge, DC arc discharge and thermoelectronic emission. Further, an HCD (hollow cathode discharge) gun may be employed in order to obtain the metal vapor and ionize the same by electrons of the HCD gun. Any metal may be readily ionized by the radio-frequency discharge and the thermoelectronic emission. Ionization by the DC arc discharge is efficiently performed, even though metals to be ionized are limited. For example, the DC arc discharge is effective in the case where Ti is employed as the evaporation metal. The HCD gun can ionize any metal with excellent efficiency. The aforementioned ionization means are not necessarily employed separately, and, for example, the thermoelectronic emission and the DC arc discharge can be combined or the HCD gun can be combined with the radio-frequency discharge. Such combination further facilitates ionization of the evaporation metal. Further, an acceleration voltage may be applied to the treated substrate in order to increase the incident speed of the ionized metal particles, so that the ionized metal particles forcibly strike the surface of the substrate thereby to further improve adhesion of the surface-coating film.

A compound of the evaporation metal and the injected ion may be formed and coated on the treated substrate. For example, in the case where Ti is employed as the evaporation metal and N is employed as the injected ion, hardening of the surface is improved by forming and coating TiN on the treated substrate. Although it is not particularly necessary for the object of the present invention, mass spectrometry may be performed on extracted and accelerated ions to extract a specific type of ion to introduce the same into an evaporation chamber.

The present invention is particularly effectively applied to the case of forming and coating carbide, nitride, oxide or boride on the substrate in order to increase the abrasion resistance and the corrosion resistance. The present invention is remarkably effective on a treated substrate requiring adhesion of the surface-coating film such as a cutting tool.

The above and other objects, features, aspects and advantages of the present invention will become more apparent from the following detailed description of the present invention when taken in conjunction with the accompanying drawings.

DESCRIPTION OF THE PREFERRED EMBODIMENTS AND OF THE BEST MODE OF THE INVENTION

EXAMPLE 1

Figure 1:
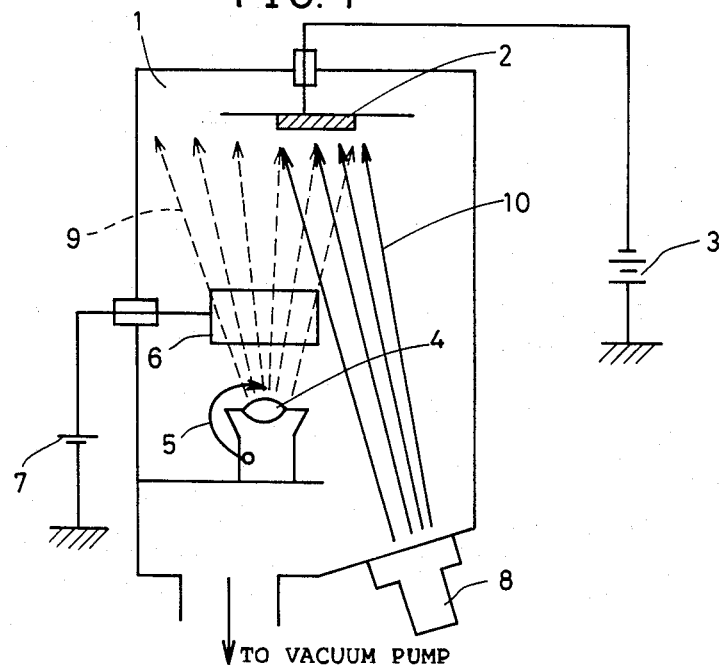
FIG. 1 illustrates an example of a device employed for carrying out the present invention.

A surface treatment device as shown in FIG. 1 was employed to form a hard layer on the surface of a substrate. A substrate material 2 is arranged within a vacuum evaporation chamber 1. The substrate material 2 is connected with a substrate accelerating power source 3, which is adapted to apply a voltage to the same. A metal 4 is contained in a crucible arranged in the vacuum evaporation chamber 1. The metal 4 is evaporated by electron beams 5, to travel along paths 9. Arranged in the travel paths 9 is an ionization electrode 6 which is connected to an ionization power source 7, and the metal vapor is ionized by the ionization electrode 6. Further, an ion generated by an ion source 8 is simultaneously accelerated or injected into the evaporation chamber 1 along paths 10. Thus, the ionized metal vapor on path 9 and the ion on path 10 emitted from the ion source 8 enter the surface of the substrate 2 to form a hard layer.

In this example, Ti was employed as the metal 4 and $N_2^+$ was employed as the injected ion. The substrate 2 was a small-diameter drill ($\phi 0.90$ mm) made of cemented carbides. A sample A-1 was prepared under the following parameters: the evaporating pressure of $1.3 \times 10^{-4}$ Pa was maintained in the chamber 1, an acceleration voltage of 0.8 KV was applied applied to the substrate 2, an acceleration voltage of 40 KV was applied to the injected ion, and a voltage of 50 V was applied by the ionization power source 7. The degree of ionization of the metal vapor was 75%.

Samples as comparison materials were prepared in the following manner: In a sample B-1, $N_2^+$ ion injection was performed while evaporating Ti, and the evaporation metal Ti was not ionized. Only $N_2^+$ ion injection was performed in a sample C-1 while TiN was coated by the CVD process on a sample D-1. TiN was coated by the ion plating process on a sample E-1, while no treatment was made on a sample F-1.

The above samples were subjected to cutting tests under the following conditions:
Workpiece: three-ply printed substrate (G10).
Revolution of Drill: 80,000 r.p.m..
Feed of Drill: 0.05 mm/rev..

Table 1 shows the hit counts to the operational lives of the respective samples.

TABLE 1

| Sample | Hit Count |
|---|---|
| A-1 (sample obtained in accordance with the present invention) | 11,100 |
| B-1 (prior art) | 6,900 |
| C-1 (prior art) | 5,500 |
| D-1 (prior art) | 1,800 |
| E-1 (prior art) | 4,300 |
| F-1 (untreated) | 3,500 |

EXAMPLE 2

Figure 2:
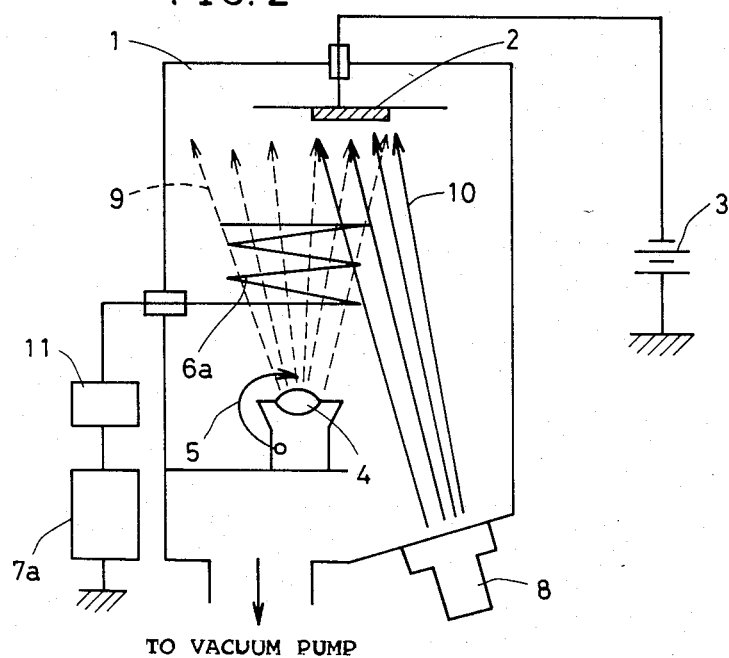
FIG. 2 illustrates another example of a device for carrying out the present invention.

A surface treatment device as shown in FIG. 2 was employed to form a hard layer on a substrate 2. Reference numerals 1 to 5 and 8 to 10 indicate components substantially identical to those in FIG. 1, and an explanation thereof is omitted. In this example, an RF electrode 6a for ionization is arranged in a vacuum evaporation chamber 1 in order to ionize the evaporation metal. The electrode 6a is connected with a matching unit 11 and a radio-frequency power source 7a.

A cutting insert of M10 cemented carbide (SNG432) was employed as the substrate 2 and Al was employed as the evaporation metal 4, while $O_2^+$ was employed as the injected ion. A test was made with the vaporization pressure of $2.5 \times 10^{-3}$ Pa in the chamber 1, an acceleration voltage of 0.2 KV was applied to the substrate 2, an acceleration voltage of 25 KV was applied to the injected ion, and an electric power of 500 W was provided by the radio-frequency power source 7a. The degree of ionization of the evaporation metal was 18%. A sample A-2 was thus obtained.

The following samples were obtained as comparison materials. In a sample B-2, $O_2^+$ ion injection was made while evaporating Al without ionization. Only $O_2$ ion injection was performed in a sample C-2, while $Al_2O_3$ was coated by the CVD process on a sample D-2. $Al_2O_3$ was coated by the ion plating process on a sample E-2, while no treatment was made on a sample F-2.

These samples were subjected to cutting tests under the following conditions:
Workpiece: SCM435(H).
Cutting Speed: 150 m/min..
Feed: 0.36 mm/rev..
Cutting Depth: 1.5 mm.

The lives of the respective samples were measured when the flank wear $V_B$ reached 0.20 mm to obtain results tabulated in Table 2. It is clear from Table 2 that the sample A-2 obtained by the surface treatment process according to the present invention is much superior to the other samples.

TABLE 2

| Sample | Life |
| --- | --- |
| A-2 (sample obtained in accordance with the present invention) | 25 min. |
| B-2 (prior art) | 14 min. |
| C-2 (prior art) | 1 min. |
| D-2 (prior art) | 15 min. |
| E-2 (prior art) | 3 min. |
| F-2 (untreated) | 5 sec. |

EXAMPLE 3

Figure 3:
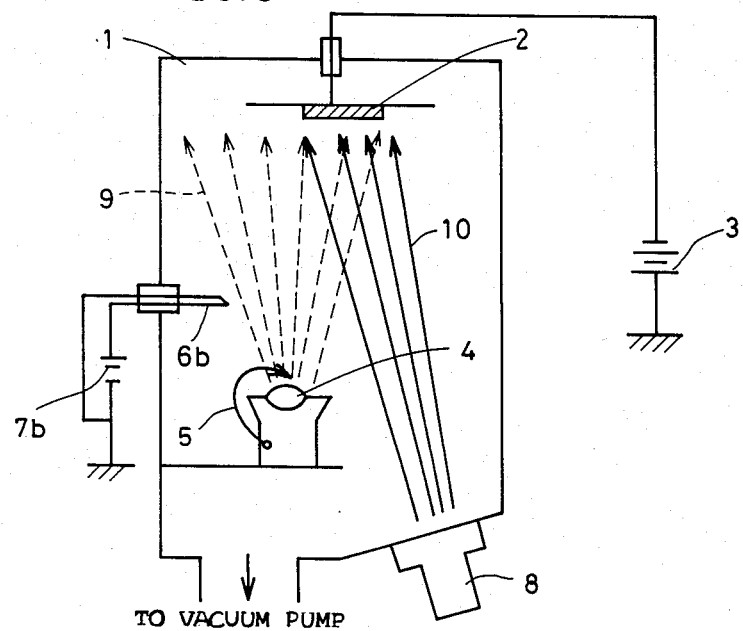
FIG. 3 illustrates still another example of a device for carrying out the present invention.

A surface treatment device as shown in FIG. 3 was employed to form a hard layer on the surface of a substrate. Reference numerals 1 to 5 and 8 to 10 indicate components substantially identical to those in FIG. 1. In this example, the ionization of the evaporation metal 4 is performed by a thermoelectronic emission filament 6b connected to a filament power source 7b.

A sample A-3 was prepared as a substrate 2 made of SNG432 high speed steel, the evaporation metal 4 was Ti and the injected ion was $C^+$. The evaporation pressure was $5 \times 10^{-4}$ Pa in the chamber 1, the acceleration voltage applied to the substrate 2 was 1.2 KV, the acceleration voltage applied to the injected ion was 60 KV, the voltage at the filament power source 7b was 12 V, and the degree of ionization of the metal vapor was 63%.

The following samples were obtained as comparison materials: In a sample B-3, $C^+$ ion injection was performed while evaporating Ti without ionization. Only $C^+$ ion injection was performed in a sample C-3 while TiC was coated by the CVD process on a sample D-3. TiC was coated by the ion plating process on a sample E-3, while no treatment was made in a sample F-3.

These samples were subjected to cutting tests under the following conditions:
Workpiece: 18-8 stainless steel.
Cutting Speed: 40 m/min..
Feed: 0.1 mm/rev..
Cutting Depth: 1.0 mm.

The operational lives of the respective samples were measured and the duration results obtained are tabulated in Table 3.

TABLE 3

| Sample | Life |
| --- | --- |
| A-3 (sample obtained in accordance with the present invention) | 20 min. |
| B-3 (prior art) | 13 min. |
| C-3 (prior art) | 9 min. |
| D-3 (prior art) | 8 min. |
| E-3 (prior art) | 5 min. |
| F-3 (untreated) | 3 min. |

EXAMPLE 4

Figure 4:
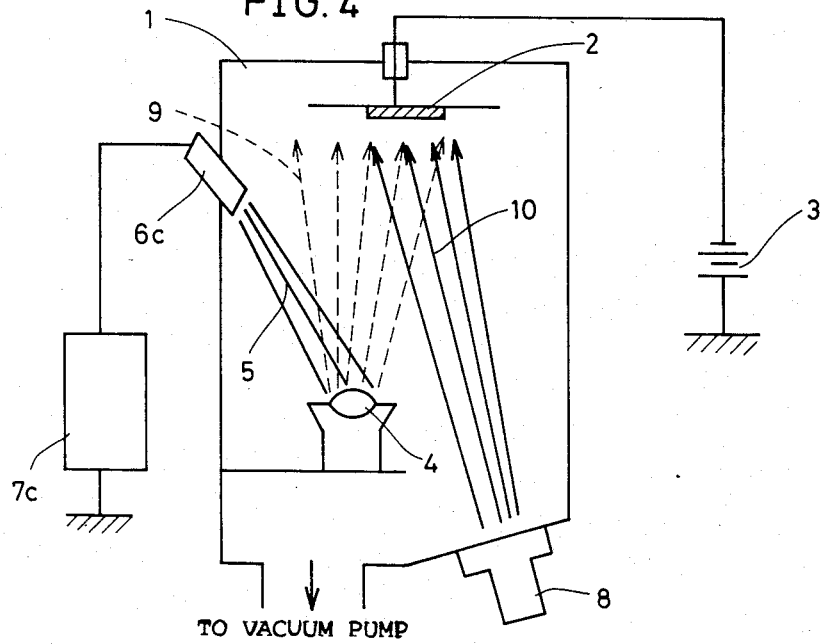
FIG. 4 illustrates a further example of a device for carrying out the present invention.

A surface treatment device as shown in FIG. 4 was employed to form a hard layer on the surface of a substrate. Reference numerals 1 to 5 and 8 to 10 as shown in FIG. 4 indicate components substantially identical to those in FIG. 1. In this example, an HCD gun 6c connected to an HCD gun power source 7c was adapted to evaporate molten metal 4. Further, ionization of the metal vapor was performed by electrons of the HCD gun 6c.

A sample A-4 was formed as a substrate 2 prepared as a cutting insert of cemented carbide K10, the evaporation metal was B and the injected ion was $N_2^+$. The evaporation pressure was $3 \times 10^{-4}$ Pa in the chamber 1, the acceleration voltage applied to the substrate 2 was 2.0 KV, the acceleration voltage applied to the injected ion was 100 KV, and the degree of ionization of the metal vapor was 82%.

The following samples were formed as comparison materials: In a sample B-4, $N_2^+$ ion injection was performed while evaporating B without ionization. Only $N_2^+$ ion injection was performed in a sample C-4 while BN was coated by the CVD process on a sample D-4. BN was coated by the ion plating process on a sample E-4, while no treatment was made on a sample F-4.

These samples were subjected to cutting tests under the following conditions:
Workpiece: FCD45.
Cutting Speed: 300 m/min..
Feed: 0.1 mm/rev..
Cutting Depth: 0.4 mm.

The operational lives of the respective samples were measured and the duration results obtained are tabulated in Table 4.

TABLE 4

| Sample | Life |
| --- | --- |
| A-4 (sample obtained in accordance with the present invention) | 12 min. |
| B-4 (prior art) | 5 min. |
| C-4 (prior art) | 3 min. |
| D-4 (prior art) | 1.5 min. |
| E-4 (prior art) | 1 min. |
| F-4 (untreated) | 30 sec. |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface treatment process for forming a thin film on the surface of a substrate positioned in an evaporation chamber for treatment, comprising the following steps:
    (a) vaporizing an evaporation metal in said evaporation chamber,
    (b) ionizing said metal vapor,
    (c) depositing said ionized metal vapor on said substrate, and
    (d) simultaneously with steps (a), (b), and (c) accelerating metal or nonmetal ions into said evaporation chamber for a simultaneous implanting of accelerated metal or nonmetal ions in or on said substrate for forming a coating of improved hardness and adhesion on said substrate.

2. The surface treatment process of claim 1, wherein said substrate to be treated is a cutting tool.

3. The surface treatment process of claim 1, wherein said evaporation metal is made of a substance or two or more substances selected from a group of Ti, Zr, Hf, V, Nb, Ta, Cr, Mo, W, Si, Al and B.

4. The surface treatment process of claim 1, wherein said metal or nonmetal ions are made of a substance or two or more substances selected from a group of $N_2^+$, $N^+$, $O_2^+$, $O^+$, $C^+$, $Si^+$ and $B^+$.

5. The surface treatment process of claim 1, wherein said first mentioned ionizing of said metal vapor is performed by a high-frequency discharge.

6. The surface treatment process of claim 1, wherein said first mentioned ionizing of said metal vapor is performed by DC arc discharge.

7. The surface treatment process of claim 1, wherein said first mentioned ionizing of said metal vapor is performed by thermoion emission.

8. The surface treatment process of claim 1, wherein said metal vapor is obtained by an HCD gun, said first mentioned ionizing of said metal vapor being performed by electrons of said HCD gun.

9. The surface treatment process of claim 1, wherein an acceleration voltage is applied to said substrate to be treated.

10. The surface treatment process of claim 1, wherein a compound of said evaporation metal and said implanted ion is formed on and coated onto said substrate to be treated.

* * * * *